(12) United States Patent
Dong et al.

(10) Patent No.: US 10,747,063 B2
(45) Date of Patent: Aug. 18, 2020

(54) DISPLAY-PANEL SUBSTRATE, FABRICATION METHOD, AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Tingze Dong, Beijing (CN); Dongsheng Huang, Beijing (CN); Zhinan Zhang, Beijing (CN); Yu Lu, Beijing (CN); Xing Qin, Beijing (CN); Zhao Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 505 days.

(21) Appl. No.: 15/757,815

(22) PCT Filed: Jun. 26, 2015

(86) PCT No.: PCT/CN2015/082464
§ 371 (c)(1),
(2) Date: Mar. 6, 2018

(87) PCT Pub. No.: WO2016/041397
PCT Pub. Date: Mar. 24, 2016

(65) Prior Publication Data
US 2018/0341153 A1   Nov. 29, 2018

(30) Foreign Application Priority Data

Sep. 16, 2014   (CN) .......................... 2014 1 0471976

(51) Int. Cl.
*G02F 1/1337*   (2006.01)
*G02F 1/1333*   (2006.01)
(Continued)

(52) U.S. Cl.
CPC ...... *G02F 1/133784* (2013.01); *G02F 1/1337* (2013.01); *G02F 1/133345* (2013.01);
(Continued)

(58) Field of Classification Search
CPC ......... G02F 1/133784; G02F 1/133345; G02F 1/133512
See application file for complete search history.

(56) References Cited

U.S. PATENT DOCUMENTS 5,910,768 A * 6/1999 Ott ..................... G08B 13/1463
340/539.1
6,433,767 B1 * 8/2002 Murade ............... G02F 1/13454
345/92
(Continued)

FOREIGN PATENT DOCUMENTS

| CN | 1542530 A | 11/2004 |
|---|---|---|
| CN | 102636910 A | 8/2012 |

(Continued)

OTHER PUBLICATIONS

International Search Report dated Jun. 26, 2015, issued in counterpart International Application No. PCT/CN2015/082464 (13 pages).
(Continued)

*Primary Examiner* — Lucy P Chien
(74) *Attorney, Agent, or Firm* — Westerman, Hattori, Daniels & Adrian, LLP (57) ABSTRACT

A display substrate (100) is provided for a display device. The display substrate (100) includes a display region with an alignment film formed on one side of the display region. A non-display region at a peripheral area of the substrate and
(Continued)

adjacent to the display region. An uneven layer (1) formed on the non-display region at a same side as the alignment film. A first film layer (2) formed on the uneven layer (1) and covering the uneven layer (1) to form a substantially flat surface of the non-display region with respect to the display region.

18 Claims, 2 Drawing Sheets

(51) Int. Cl.
*G02F 1/1335* (2006.01)
*G02F 1/1362* (2006.01)
*H01L 21/66* (2006.01)
*H01L 27/12* (2006.01)

(52) U.S. Cl.
CPC .. *G02F 1/133512* (2013.01); *G02F 1/133514* (2013.01); *G02F 1/136286* (2013.01); *H01L 22/32* (2013.01); *H01L 27/124* (2013.01); *H01L 27/1259* (2013.01); *G02F 2001/133357* (2013.01); *G02F 2001/133388* (2013.01); *G02F 2001/136254* (2013.01); *G02F 2201/123* (2013.01)

(56) References Cited

U.S. PATENT DOCUMENTS

2007/0085962 A1* 4/2007 Yoshioka ............ G02F 1/13452
349/149

2008/0231781 A1* 9/2008 Ge .................... G02F 1/133553
349/113

FOREIGN PATENT DOCUMENTS

| CN | 102929042 A | 2/2013 |
| CN | 103488333 A | 1/2014 |
| CN | 103761019 A | 4/2014 |
| CN | 103869546 A | 6/2014 |
| CN | 104280939 A | 1/2015 |
| JP | 2002-040454 A | 2/2002 |
| KR | 20080052986 A | 6/2008 |

OTHER PUBLICATIONS

Office Action dated Aug. 29, 2016 issued in counterpart Chinese Application No. 201410471976.7 (7 pages).
Office Action dated Feb. 28, 2017 issued in counterpart Chinese Application No. 201410471976.7 (7 pages).
Office Action dated Aug. 1, 2017 issued in counterpart Chinese Application No. 201410471976.7 (9 pages).
Office Action dated Jan. 10, 2018 issued in counterpart Chinese Application No. 201410471976.7 (5 pages).
Office Action dated Dec. 29, 2018, issued in counterpart Chinese Application No. 201410471976.7, with English translation. (16 pages).
Office Action dated Sep. 16, 2019, issued in counterpart CN Application No. 201410471976.7, with English translation (19 pages).
Office Action dated Jan. 15, 2020, issued in counterpart CN application No. 201410471976.7, with English translation. (27 pages).

* cited by examiner

DISPLAY-PANEL SUBSTRATE, FABRICATION METHOD, AND DISPLAY APPARATUS

CROSS-REFERENCES TO RELATED APPLICATIONS

This PCT patent application claims priority of Chinese Patent Application No. 201410471976.7, filed on Sep. 16, 2014, the entire contents of which are incorporated by reference herein.

FIELD OF THE INVENTION

The present invention generally relates to the display technologies and, more particularly, to a display panel substrate and a display apparatus containing the same.

BACKGROUND

Because of small size, low power consumption, and no radiation, etc., liquid crystal display (LCD) devices have become mainstream products of the current flat panel display devices. An LCD panel is a key component of an LCD device. The LCD panel generally includes an array substrate and a color-filter substrate coupled together, and liquid crystal is placed between the array substrate and the color-filter substrate.

To make the liquid crystal in the LCD panel maintain a particular orientation when no voltage is applied, an alignment film needs to be formed on each of the facing surfaces of the array substrate and the color-filter substrate. Grooves with the particular orientation can then be formed on the surfaces of the alignment films, and these grooves are often formed by robbing the alignment films with a rubbing cloth.

However, during the rubbing process on the alignment film of the array substrate, it is likely to incur Rubbing Mura, also called rubbing marks, i.e., irregularity of the grooves on the surface of the alignment film, due to poor rubbing consistency by the rubbing cloth when the rubbing cloth is used to rub the surface of the alignment film for forming the grooves. The Rubbing Mura may severely affect the display quality of the LCD panel.

The disclosed method and system are directed to at least partially alleviate one or more problems set forth above and other problems.

BRIEF SUMMARY OF THE DISCLOSURE

There is provided a display substrate and a display device. The display substrate includes a first film layer on a non-display region to produce a flat surface on the non-display region, reducing the occurrence of the Rubbing Mura and improving the display quality of the display substrate. The surface of the non-display region may be covered by a same material, or the surface of the non-display region and the surface of the display region may be covered by a same material. When the rubbing cloth only makes contact with the same material, damage to the robbing cloth may be reduced, also reducing the occurrence of the Rubbing Mura.

One aspect of the present disclosure includes a display substrate. The display substrate includes a display region with an alignment film formed on one side of the display region; a non-display region at a peripheral area of the substrate and adjacent to the display region; an uneven layer formed on the non-display region at a same side as the alignment film; and a first film layer formed on the uneven layer and covering the uneven layer to form a substantially flat surface of the non-display region with respect to the display region.

Optionally, the substantially flat surface of the non-display region is configured according to and transitioned to the surface of the display region such that the non-display region maintains consistent orientation of a rubbing cloth during a rubbing process when the rubbing cloth moves from the non-display region to the display region.

Optionally, the display substrate is an array substrate, the uneven layer includes signal testing lines and signal testing pads located on the non-display region of the substrate, the first film layer completely covers the signal testing lines and signal testing pads and is sheet-shaped.

Optionally, the first film layer is a conductive layer, an insulating layer is formed between the first film layer and the signal testing lines and the signal testing pads, the first film layer is arranged as a plurality of sheet sub-film-layers, and each sub-film-layer at least partially overlaps with a different signal testing line or signal testing pad, and an area where each sub-film-layer covers a different signal testing line or signal testing pad has a via, such that the signal testing line or signal testing pad is electrically connected to the sub-film-layer through the via.

Optionally, the display substrate is an array substrate, the uneven layer includes signal testing lines and signal testing pads located on the non-display region of the substrate, wherein the signal testing lines are closer to an edge of the array substrate than the signal testing pads, a first portion of the first film layer covering the signal testing pads is sheet-shaped, and a second portion of the first film layer covering the signal testing lines is strip-shaped.

Optionally, the first portion of the first film layer covering the signal testing pads is arranged as a plurality of sheets of first sub-film-layers, each first sub-film-layer corresponding to a different signal testing pad and an adjacent insulation sheet.

Optionally, the second portion of the first film layer covering the signal testing lines is arranged as a plurality of strips of second sub-film-layers arranged in parallel and with an equal width; distance between any two strips of second sub-film-layers is equal; and a direction along length of the strips of second sub-film-layers is same as orientation of the alignment film.

Optionally, the distance between two adjacent strips of the second sub-film layers is greater than or equal to a diameter of cloth fiber of the rubbing cloth for forming the orientation of the alignment film in the rubbing process.

Optionally, the distance between two adjacent strips of the second sub-film-layers is in the range of approximately 10-13 μm; and a width of the strips of the second sub-film-layers is in the range of approximately 10-15 μm.

Optionally, the first film layer is a conductive layer; an insulating layer is formed between the first film layer and the signal testing lines and the signal testing pads; an area where each first sub-film-layer covers a different signal testing pad has a first via, such that the signal testing pad is electrically connected to the first sub-film-layer through the first via; and an area where certain second sub-film-layer covers a different signal testing line has a second via, such that the signal testing line is electrically connected to the second sub-film-layer through the second via.

Optionally, pixel electrodes formed on the display region of the array substrate, wherein the first film layer is made of a same material as the pixel electrodes and is formed in a same patterning process as the pixel electrodes.

Optionally, the first film layer is a non-conductive layer; and areas covering the signal testing lines and the signal testing pads have openings such that external signal testing probes are connected with the signal testing lines and the signal testing pads through the openings.

Optionally, the uneven layer includes a coding region adjacent to the signal testing lines and the signal testing pads for forming an identification code to identify the substrate; and a portion of the first film layer covering the coding region is sheet-shaped, and separate from the portion of the first film layer covering the signal testing lines and the signal testing pads.

Optionally, the display substrate is a color-filter substrate; the uneven layer includes a back array and color film layer located in the non-display region close to edge of the color-filter substrate; and the first film layer is strip-shaped.

Optionally, a flat layer formed in the display region of the color-filter substrate; and the first film layer is made of a same material as the flat layer and formed in a same patterning process as the flat layer.

Another aspect of the present disclosure includes a display device including the above described display substrate.

Another aspect of the present disclosure includes a fabrication method for a display substrate. The display substrate has a display region and a non-display region at a peripheral area of the substrate. The fabrication method includes forming an uneven layer on the non-display region, where the uneven layer includes signal testing lines and signal testing pads located on the non-display region of the substrate; and forming a first film layer on the uneven layer, covering the uneven layer, to form a substantially flat surface of the non-display region with respect to the display region.

Optionally, the display region has an alignment film formed on one side of the display region, the noon-display region is positioned adjacent to the display region, and forming the first film layer further includes: forming the first film layer to form a substantially flat surface of the non-display region with respect to the display region such that the non-display region maintains consistent orientation of a rubbing cloth during a rubbing process when the rubbing cloth moves from the non-display region to the display region.

Optionally, the first film layer is a conductive layer, and forming the first film layer further includes forming an insulating layer between the first film layer and the uneven layer including the signal testing lines and the signal testing pads; arranging the first film layer as a plurality of sheet sub-film-layers, the sub-film-layers at least partially overlapping with different signal testing lines or signal testing pads; and selectively and electrically connecting the sub-film-layers to the different signal testing lines or signal testing pads through vias.

Optionally, the display substrate is an array substrate, and forming the first film layer further includes forming a sheet-shaped first portion of the first film layer covering the signal testing pads; and forming a strip-shaped second portion of the first film layer covering the signal testing lines.

Optionally, the first portion of the first film layer covering the signal testing pads is arranged as a plurality of sheets of first sub-film-layers, each first sub-film-layer corresponding to a different signal testing pad and an adjacent insulation sheet.

Optionally, the second portion of the first film layer covering the signal testing lines is arranged as a plurality of strips of second sub-film-layers arranged in parallel and with an equal width; distance between any two strips of second sub-film-layers is equal; and a direction along length of the strips of second sub-film-layers is same as alignment orientation of the alignment film.

Optionally, the distance between two adjacent strips of the second sub-film layers is greater than or equal to a diameter of cloth fiber of the rubbing cloth for forming the alignment orientation of the alignment film in the rubbing process.

Optionally, the distance between two adjacent strips of the second sub-film-layers is in the range of approximately 10-13 µm; and a width of the strips of the second sub-film-layers is in the range of approximately 10-15 µm.

Optionally, the first film layer is a conductive layer, and the fabrication method further includes forming an insulating layer between the first film layer and the signal testing lines and the signal testing pads, wherein an area where each first sub-film-layer covers a different signal testing pad has a first via, such that the signal testing pad is electrically connected to the first sub-film-layer through the first via; and an area where certain second sub-film-layer covers a different signal testing line has a second via, such that the signal testing line is electrically connected to the second sub-film-layer through the second via.

Other aspects of the present disclosure can be understood by those skilled in the art in light of the description, the claims, and the drawings of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

Figure 4:
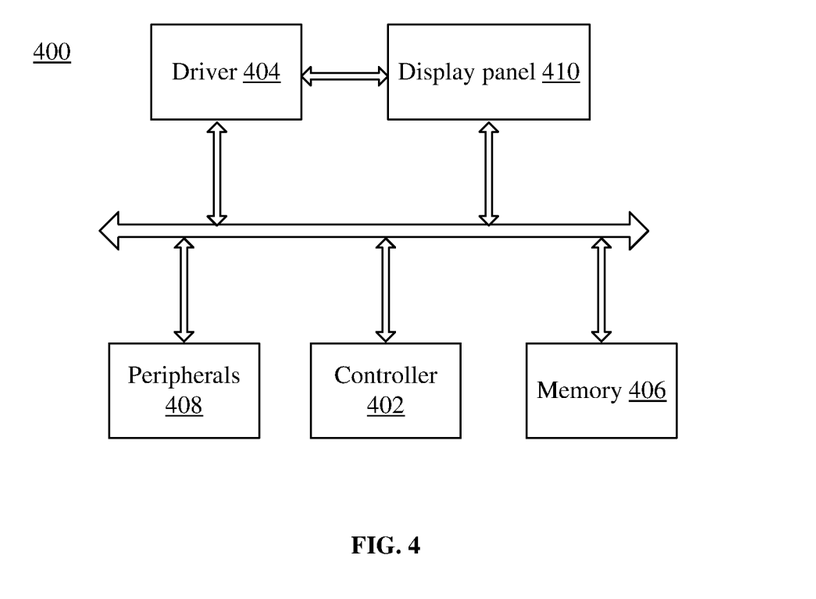
FIG. 4 illustrates a block diagram of an exemplary display device according to the disclosed embodiments.

FIG. 4 illustrates an exemplary display device 400 incorporating certain disclosed embodiments. The display device 400 may be any appropriate device or component with certain display function, such as an LCD panel, an LCD TV, a monitor, a cell phone or smartphone, a computer, a tablet, or a navigation system, etc. As shown in FIG. 4, display device 400 includes a controller 402, driver circuitry 404, memory 406, peripherals 408, and a display panel 410. Certain devices may be omitted and other devices may be included.

The controller 402 may include any appropriate processor or processors, such as a general-purpose microprocessor, digital signal processor, and/or graphic processor. Further, the controller 402 can include multiple cores for multi-thread or parallel processing. The memory 406 may include any appropriate memory modules, such as read-only memory (ROM), random access memory (RAM), flash memory modules, and erasable and rewritable memory, and other storage media such as CD-ROM, U-disk, and hard disk, etc. The memory 406 may store computer programs for implementing various processes, when executed by the controller 402.

Peripherals 408 may include any interface devices for providing various signal interfaces, such as USB, HDMI, VGA, DVI, etc. Further, peripherals 408 may include any input and output (I/O) devices, such as keyboard, mouse, and/or remote controller devices. Peripherals 408 may also include any appropriate communication module for establishing connections through wired or wireless communication networks.

The driver circuitry 404 may include any appropriate driving circuits to drive the display panel 410. The display panel 410 may include any appropriate flat panel display, such as an LCD panel, etc. During operation, the display 410 may be provided with image signals by the controller 402 and the driver circuitry 404 for display.

In certain embodiments, display panel 410 may include an LCD panel, such as a thin-film-transistor (TFT) LCD panel. The LCD panel may include a first or a front substrate, a second or a rear substrate, and liquid crystal filled between the substrates. The first substrate may be a color-filter substrate for forming a color-filter film and the second substrate may be an array substrate for forming an active matrix, e.g., a TFT array. When a substrate (e.g., a color-filter substrate or an array substrate) is manufactured, the substrate may be manufactured individually, or multiple substrates may be manufactured together as part of a large substrate before being cut into individual substrates later.

When manufacturing the display panel substrate (also referred as display substrate or simply substrate), a rubbing process is used to set the alignment orientation of an alignment film or film layer on the substrate. As described in the background section, a phenomenon called Rubbing Mura may occur when a rubbing cloth is used to rub the substrate for forming the proper alignment film on the substrate.

Under certain circumstances, Rubbing Mura may be caused by the difference in wiring layout of the peripheral circuitry of the substrate, such as different height among the wiring layout and/or different height between the wiring layout and the electrode layer of the display/center region of the substrate, or different materials forming the wiring layout and/or the electrode layer of the substrate. The peripheral or outer circuitry may include certain signal testing lines and signal testing pads located in one or more non-display regions of the substrate for testing whether the display panel is in normal condition or with a desired quality. The signal testing lines and the signal testing pads can pass test signals through lead wires into the inside of the substrate for testing. The lead wires may be formed by an Indium-Tin Oxide (ITO) material. Other peripheral structures or layouts may also have the same function.

Further, to facilitate passing through of the test signals, the width of the lead wires is often greater than or equal to the width of the signal testing lines and/or the signal testing pads. In addition, the distribution of the signal testing lines and/or the signal testing pads within the non-display region of the substrate is often not uniform. That is, some parts of the non-display region contains the signal testing lines and/or the signal testing pads, while some parts of the non-display region does not contain the signal testing lines and/or the signal testing pads. Further, the signal testing lines and/or the signal testing pads may not be located on the same layer. Thus, the non-display region may have an uneven surface, which generates vertical differences, or end differences, among lead wires corresponding to different signal testing lines and/or different signal testing pads with respect to the surface of the non-display region.

Further, in the rubbing process by the rubbing cloth for rubbing the substrate to create the orientation of the alignment film, alignment orientation, the rubbing cloth usually starts rubbing from one side of the substrate, gradually moves in the direction to the other side of the array substrate, and stops rubbing until reaching the other side of the array substrate. Because the rubbing cloth needs to go through the uneven surface of the non-display region of the substrate, the uneven surface makes the orientation of the rubbing cloth fiber chaotic, i.e., the orientation of the rubbing cloth fiber is inconsistent.

Thus, when the rubbing cloth enters into the display region from the non-display region, the orientation of the grooves formed by the rubbing action of the rubbing cloth becomes inconsistent as well, thereby causing Rubbing Mura and severely affecting the picture quality the LCD panel. The disclosed embodiments provide an improved display substrate with a substantially flat and even surface on the non-display region of the display substrate.

Figure 1:
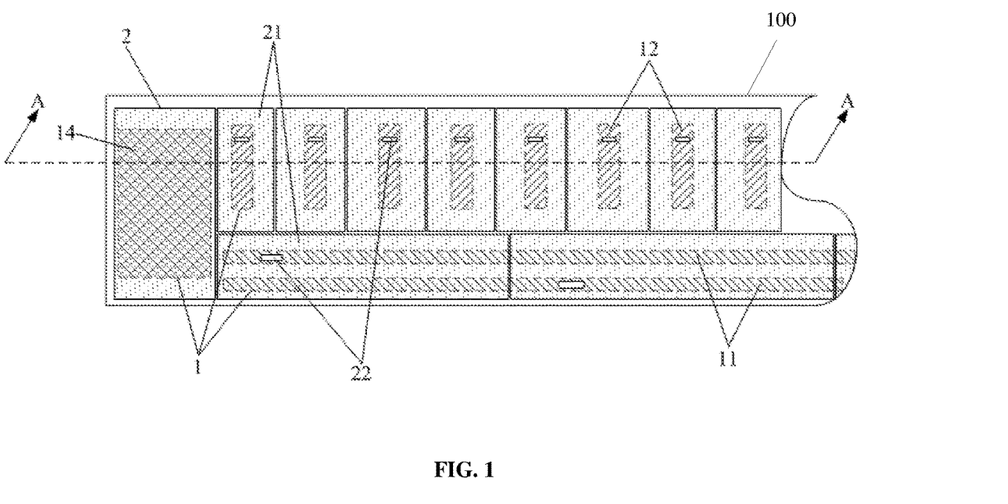
FIG. 1 illustrates a portion of an exemplary substrate of an LCD panel according to the disclosed embodiments.
Figure 2:
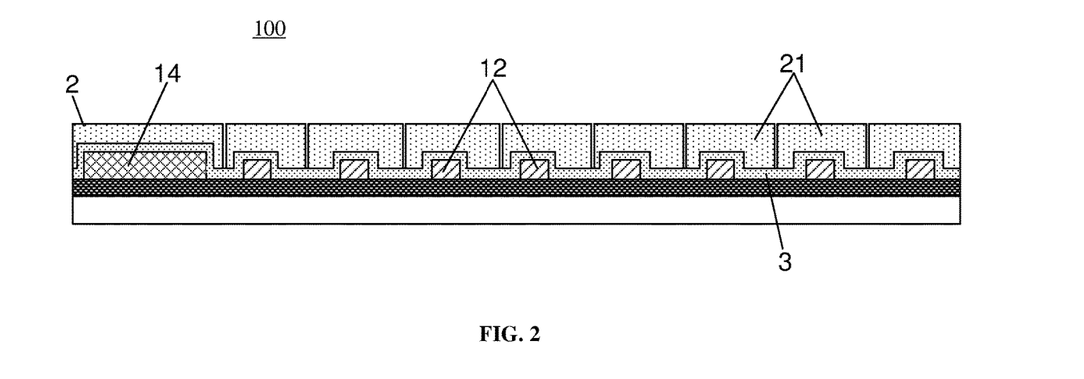
FIG. 2 illustrates a cross-sectional view along section line AA in FIG. 1.

FIGS. 1 and 2 illustrate an exemplary display substrate according to a disclosed embodiment. FIG. 2 is a cross-sectional view of FIG. 1 along the AA line. As shown in FIG. 1, a display panel substrate 100 is provided.

The substrate 100 has a display region (not shown) and one or more non-display regions located on the outside or around the periphery of the display region. The surface area of the display region of the substrate 100 is configured to form the alignment film. On the same side of the substrate as the alignment film, the non-display region of the substrate 100 may include certain wiring layout and/or other peripheral structures, such as testing pads, etc., which may have an uneven surface, and such wiring layout and/or other peripheral structures are also called an uneven layer, and a first film layer is formed on the uneven surface, i.e., covering the uneven layer, and has a substantially flat surface. That is, the first film layer forms a flat and even top-surface of the non-display region of the display substrate.

Thus, with the formation of the first film layer, the surface of the substrate corresponding to the non-display region of the substrate is flat and even. In the rubbing process by the rubbing cloth for forming the rubbing orientation on the alignment film, the rubbing cloth starts rubbing from one side/edge of the substrate, and gradually moves to the other side of the substrate. When the rubbing cloth first passes through the non-display region of the substrate and onto the display region of the substrate, the flat and even surface of the non-display region of the substrate may ensure that the orientation of the rubbing cloth fiber is consistent.

Thus, when the rubbing cloth enters into the display region of the substrate from the non-display region, the orientation of the grooves on the alignment film formed by the rubbing cloth becomes consistent. Thus, Rubbing Mura is less likely to occur, and the display quality of the display substrate can be improved. At the same time, the flat and even surface of the non-display region can reduce the wear and tear of the rubbing cloth, thereby extending the usage life of the rubbing cloth and reducing the production cost of the display substrate. Further, the surface of the non-display region may be covered by a same material, or the surface of the non-display region and the surface of the display region may be covered by a same material. When the robbing cloth only makes contact with the same material, damage to the robbing cloth may be further reduced, also further reducing the occurrence of the Rubbing Mura.

Referring to FIGS. 1 and 2, the substrate 100 may be an array substrate or any other type of substrate (e.g., a color-filter substrate). An uneven layer 1 may include signal testing lines 11 and signal testing pads 12 located on a non-display region on each side of the substrate 100. Other similar structures may also be included.

The first film layer 2, as a plurality of closely-arranged sheets or pads, is formed on the uneven layer 1 and covers entirely the signal testing lines 11 and signal testing pad 12, with each signal testing line 11 and signal testing pad 12 being covered by a respective sheet of the first film layer 2. That is, the first film layer 2 can completely cover the signal testing lines 11 and signal testing pads 12 in the non-display region of the substrate 100, such that the non-display region has a substantially flat and even surface to prevent or reduce exposure of the uneven layer 1, and thereby reducing Rubbing Mura during the rubbing process for forming the alignment film on the display region of the substrate. Under certain circumstances, the first film layer 2 may cover just the significant part of the signal testing lines 11 and signal testing pads 12 in the non-display region of the substrate 100 to realize the same effect. The substantial flat and even surface may have a desired degree of flatness for reducing or removing Rubbing Mura, such as a complete flatness or a flatness with a single-layer height difference, etc.

More specifically, the first film layer 2 may be a conductive layer, and an insulating layer 3 may be formed between the first film layer 2 and the signal testing lines 11 and the signal testing pads 12. The first layer 2 is divided into or arranged as a plurality of sub-film-layers 21, and each sub-film-layer 21 may be a sheet of the divided first film layer 2. The plurality of sheets or sub-film-layers may be in a regular geometric shape, such as a square, a rectangle, a triangle, etc., or in an irregular shape, and different sheets may have different shapes and sizes.

Further, each sheet or sub-film-layer 21 may respectively correspond to a different signal testing line 11 or signal testing pad 12, and may overlap with the corresponding signal testing line 11 or signal testing pad 12 at least partially. The area where each sub-film-layer 21 covers a different signal testing line 11 or signal testing pad 12 may have a via 22, such that the signal testing line 11 or signal testing pad 12 may be electrically connected to the respective sub-film-layer 21 through the via 22.

It should be noted that, the spacing or distance between the plurality of sheet-shaped sub-film-layers 21 can be small or as small as practically possible, as long as the different sub-film-layers 21 can be kept insulated from each other. Of course, if a signal testing pad 12 and a signal testing line 11 are used to input a same testing signal, i.e., the signal testing pad 12 and signal testing line 11 are connected, the two sub-film-layers 21 covering the signal testing pad 12 and signal testing line 11 can be a single sheet.

Because each sub-film-layer 21 is conductive and can be electrically connected with corresponding signal testing line 11 and/or signal testing pad 12 through the via 22, after the first film layer 2 is divided into or arranged as a plurality of sub-film-layers 21, not only the surface of the non-display region of the substrate can be flat and even to avoid Rubbing Mura, but also significantly-large-size sub-film-layers 21 can be used to lead external testing signals into the corresponding signal testing lines 11 and/or signal testing pads 12, greatly facilitating signal testing of the array substrate.

In certain embodiments, there are pixel electrodes formed on the display region of the array substrate (not shown), and the first film layer 2 may be made of the same material as the pixel electrodes. The first film layer 2 may also be formed in the same patterning process as the pixel electrodes.

For example, the pixel electrodes usually are made of indium tin oxide material, and the first film layer 2 may also be made of indium tin oxide material. Thus, when the pixel electrodes is fabricated, a same mask can be used to simultaneously form the pixel electrodes in the display region as well as the first film layer 2 in the non-display regions of the substrate. That is, the first film layer 2 can be fabricated without adding additional process steps.

In other words, the pattern for pixel electrodes (e.g., the ITO pattern) can be maximized to include both the display region and the non-display region of the substrate. Thus, edges of the ITO pattern may be configured to be in the same plane as the first film layer of the non-display region, or at most to have one layer end-difference with the first film layer of the non-display region. Thus, the non-display region and the display region may be transitioned smoothly, i.e., the height difference between the non-display region and the display region may be substantially small and the interface between the non-display region and the display region may be smooth. In certain embodiments, ITO pattern may also be configured to form the vias 22 (or via through holes) at the same time for electrical connectivity.

It should be noted that the first film layer 2 may also be made of other conductive materials, such as silver and copper, etc.

Further, when the first film layer 2 is made of the ITO material, same as the pixel electrodes, the first film layer 2 may be in a similar shape to that of the first film layer 2 made of other materials. For example, the ITO first film layer 2 may be in a shape of a plurality of sheets or stripes, or the ITO first film layer 2 may be in a shape of a single sheet. When the ITO first film layer 2 is a single sheet, the ITO first film layer 2 may be electrically connected with one of the signal testing lines and the signal testing pads through a via, and other signal testing lines and signal testing pads may be insulated by the insulating layer 3 from the ITO firm film layer 2. Further, alternatively or optionally, the insulating layer 3 may have a substantially flat and even surface such that the ITO first film layer 2 may also be substantially flat and even when formed with a sputter deposition process.

Further, in certain embodiments, the uneven layer 1 may also include a coding region 14 located adjacent to the signal testing lines 11 and the signal testing pads 12. The coding region 14 may be used to form identification codes of the substrate to identify the substrate, and a corresponding sheet-type first film layer 2 also covers the coding region 14. Further, the portion of first film layer 2 covering the coding region 14 may be separate from the portion of first film layer 2 covering the signal testing lines 11 and the signal testing pads 12. Thus, without affecting the normal formation and read-out of the identification codes of the substrate, it can be ensured that the surface of the non-display region is flat and even, reducing Rubbing Mura during the rubbing process for forming the alignment film.

Figure 3:
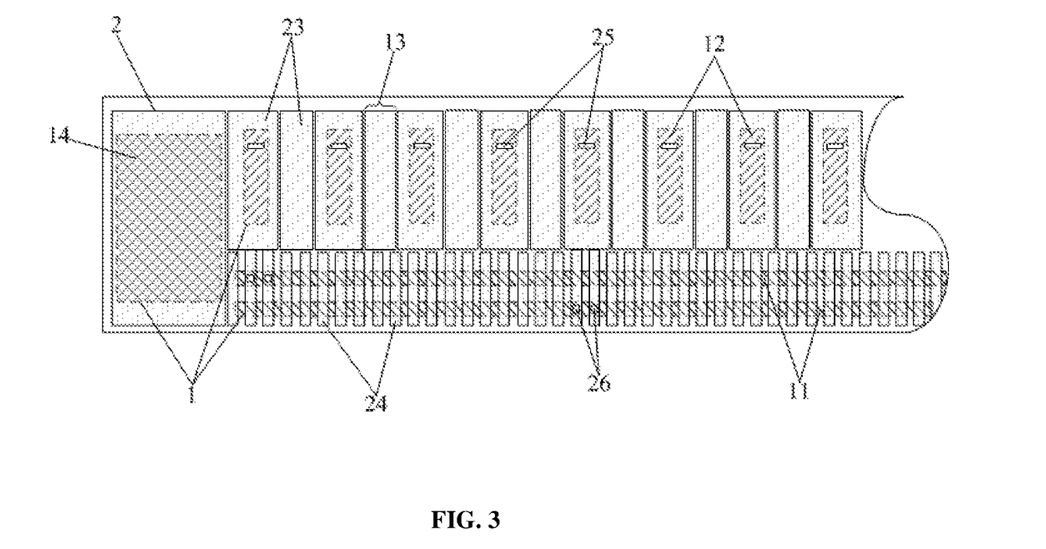
FIG. 3 a portion of another exemplary substrate of an LCD panel according to the disclosed embodiments.

FIG. 3 illustrates another exemplary display substrate consistent with the disclosed embodiments. As shown in FIG. 3, similar to the display substrate in FIG. 1, a first film layer 2 is formed on the uneven layer 1 of the substrate, and the signal testing lines 11 and the signal testing pads 12 are located in the non-display region of the substrate. Further, the signal testing lines 11 are closer to the edge of the array substrate than the signal testing pads 12. A plurality of sheet sub-film-layers of the first film layer 2 cover the signal testing pads 12; while a plurality of strip sub-film-layers of the first film layer 2 cover the signal testing lines 11.

That is, the portion of the first film layer 2 covering the signal testing pads 12 is divided into or arranged as a plurality of sheets or first sub-film-layers 23 and a plurality of insulation sheets 13 between the neighboring first subfilm-layers 23. Each first sub-film-layer 23 correspond to a different signal testing pad 12 and an adjacent insulation sheet 13. The plurality of sheets of the first sub-film-layers 23 can produce a flat and even surface of the portion of the non-display region having the signal testing pads 12, reducing Rubbing Mura during the rubbing process for forming the alignment film.

Further, the portion of the first film layer 2 covering the signal testing lines 11 is divided into or arranged as a plurality of strips or second sub-film-layers 24. The plurality of strips are arranged in parallel and the spacing or distance between any two strips may be equal, and the direction along the length of the strips is the same as the orientation of the alignment film (i.e., the direction of grooves of the alignment film). Thus, when the rubbing cloth moves across the second sub-film-layers 24 along the length direction of the strips, the rubbing cloth can have a same orientation for the cloth fiber of the rubbing cloth as the rubbing direction on the display region.

In certain embodiments, the spacing or distance between two adjacent strips of the second sub-film layers 24 may be greater than or equal to the diameter of the cloth fiber of the rubbing cloth for forming the alignment film in the rubbing process. For example, the spacing or distance between two adjacent strips of the second sub-film-layers 24 may be in a range of approximately 10-13 µm, and the width of individual strip may be in the range of approximately 10-15 µm.

Because the diameter of the rubbing cloth fiber is usually approximately 12 µm or so, the rubbing cloth fiber may pass through the spacing between two adjacent strips of the second sub-film-layers 24. At the same time, because the width of the strips of the second sub-film-layer 24 is also approximately equal to the width of the space between the adjacent strips (i.e., the diameter of the rubbing cloth fiber), the contour and the configuration of the portion of the first film layer 2 covering the signal testing lines 11 may form a comb with respect to the rubbing cloth. That is, when the rubbing cloth moves through this portion of the first film layer 2, this portion of the first film layer 2 can comb through the rubbing cloth fiber such that the orientation of the rubbing cloth fiber becomes consistent.

Thus, when the rubbing cloth moves to the display area to rub the alignment film on the display area of the substrate, the orientation of the rubbing cloth fiber remains consistent, further reducing occurrence of Rubbing Mura. In addition, the comb-shaped portion of the first film layer 2 can reduce the wear and tear of the rubbing cloth fiber when combing through the rubbing cloth fiber, extending the usage life of the rubbing cloth and reducing the production cost of the display substrate.

Further, it should also be noted that, because the signal testing lines 11 are closer to the edge of the array substrate than the signal testing pads 12, the comb-shaped portion of the first film layer 2 covering the signal testing lines 11 is closer to the edge of the array substrate than the sheet-shaped portion of first film layer 2 covering the signal testing pads 12. When using the rubbing cloth to rub the display region of the array substrate to form the alignment film, the rubbing cloth moves from the non-display region at one side of the substrate to the non-display region of the other side of the substrate. Thus, the rubbing cloth may at first rub through the non-display region close to the edge of the substrate.

That is, the rubbing cloth may be first combed by the comb-shaped portion of the first film layer 2, then pass through the sheet-shaped portion of the first film layer 2, and then reach and rub the display region of the substrate to form the alignment film. Because the rubbing cloth is first combed by the comb-shaped portion of the first film layer 2, the orientation of the rubbing cloth fiber can remain consistent, reducing occurrence of Rubbing Mura in the rubbing process for forming the alignment film.

Still referring to FIG. 3, the first film layer 2 may be a conductive layer, and an insulating layer 3 may be formed between the first film layer 2 and the signal testing lines 11 and the signal testing pads 12 (not shown in FIG. 3). The area where each first sub-film-layer 23 covers a different signal testing pad 12 may have a first via 25, such that the signal testing pad 12 may be electrically connected to the respective first sub-film-layer 23 through the first via 25. The area where certain second sub-film-layer 24 covers a different signal testing line 11 may have a second via 26, such that the signal testing line 11 may be electrically connected to the respective second sub-film-layer 24 through the second via 26.

Not every strip-shaped second sub-film-layer 24 needs to be electrically connected to the respective signal testing line 11, and only a certain small number of second sub-film-layers 24 are electrically connected to the respective signal testing lines 11 such that external testing signals can be led into the signal testing lines 11. Thus, only areas where the certain small number of second sub-film-layers 24 covering the respective signal testing lines 11 need to have the second via 26. Similarly, because each signal testing pad 12 needs to lead in different testing signals, the area where each first sub-film-layer 23 covering the respective signal testing pad 12 has the first via 25.

It should be noted that, because different signal testing pads 12 lead in different testing signals through the respective first sub-film-layers 23, different first sub-film-layers 23 covering the signal testing pads 12 are insulated from each other. That is, the first sub-film-layers 23 are separate from each other. Other configurations may also be used. Further, although the via structure is used for illustrative purposes, through holes may also be used instead of vias and other materials or connection schemes may be used to make electrical connections through the through holes.

Alternatively, in certain embodiments, the first film layer 2 formed on the uneven layer 1 of the substrate may be a non-conductive layer, and areas covering the signal testing lines 11 and the signal testing pads 12 may have openings or vias such that external testing probes or pads can be connected with the signal testing lines 11 and the signal testing pads 12.

When the formed first film layer 2 is the non-conductive first film layer, the surface of the corresponding non-display region of the array substrate can also be flat and even, reducing occurrence of Rubbing Mura in the rubbing process for forming the alignment film on the display region of the substrate, thereby improving the display quality of the substrate. At the same time, the flat and even surface of the non-display region can reduce wear and tear of the rubbing cloth, extending the usage life of the rubbing cloth and reducing the production cost of the display substrate. Further, through the openings in the non-conductive first film layer, testing signals from external signal probes or pads can be led into the signal testing lines and/or the signal testing pads, without impacting normal testing of the array substrate.

In certain embodiments, the first film layer may be made of resin or other insulating film material. Accordingly, because the first film layer is a non-conductive layer, the portion of the first film layer covering the coding region and the portion of the first film layer covering the signal testing lines and the signal testing pads can be merged into one single piece, or they can be divided or separate as well. Whether it is a divided first film layer or an intact or single piece first film layer, it can ensure that the surface of the non-display region of the array substrate is flat and even, reducing occurrence of Rubbing Mura in the rubbing process for forming the alignment film.

Further, although the array substrate is used for illustrative purposes, other types of substrates can also be used. For example, the color-filter substrate can also be used. That is, the display substrate is a color-filter substrate. Accordingly, the uneven layer may include a back array and color film layer located in the non-display region close to edge of each side of the color-filter substrate. In certain embodiments, the first film layer may be divided into or arranged as a plurality of strips.

That is, the first film layer can be divided into or arranged as a plurality of strips of sub-film-layers. The plurality of strips are arranged in parallel and the spacing or distance between any two sub-film-layers may be equal, and the direction along the length of the strip-shaped sub-film-layers is the same as the orientation of the alignment film. Thus, when the rubbing cloth moves across the strip-shaped sub-film-layers along the length direction of the strips, the rubbing cloth can have a same orientation for the cloth fiber of the rubbing cloth as the rubbing direction on the display region.

In certain embodiments, the spacing or distance between two adjacent strips of the sub-film layers may be greater than or equal to the diameter of the cloth fiber of the rubbing cloth for forming the alignment film in the rubbing process. For example, the spacing or distance between two adjacent strips of the sub-film-layers may be in the range of approximately 10-13 μm, and the width of individual strip may be in the range of approximately 10-15 μm.

Because the diameter of the rubbing cloth fiber is usually approximately 12 μm or so, the rubbing cloth fiber may pass through the spacing between two adjacent strips of the sub-film-layers. At the same time, because the width of the strips of the sub-film-layer is also approximately equal to the width of the space between the adjacent strips (i.e., the diameter of the rubbing cloth fiber), the contour and the configuration of the first film layer may form a comb with respect to the rubbing cloth. That is, when the rubbing cloth moves through the first film layer, the first film layer can comb through the rubbing cloth fiber such that the orientation of the rubbing cloth fiber becomes consistent. Thus, when the rubbing cloth moves to the display area to rub the alignment film on the display area of the substrate, the orientation of the rubbing cloth fiber remains consistent, further reducing occurrence of Rubbing Mura. Further, the comb-shaped first film layer can reduce the wear and tear of the rubbing cloth fiber when combing through the rubbing cloth fiber, extending the usage life of the rubbing cloth and reducing the production cost of the color-filter substrate.

Further, a flat layer may be formed in the display region of the color-filter substrate, and the first film layer may be made of the same material as the flat layer, and may be formed in the same patterning process using the same mask. Thus, the first film layer can be fabricated without adding additional process steps. For example, the flat layer may be made of an insulating material, such as resin, and the first film layer may also be made of the insulating material.

It should be noted that the first film layer may be formed in the separate patterning process using a different mask, and may also be made of a conductive material. In addition, the first film layer may be in a sheet shape. The first film layer may be a single sheet without being divided, i.e., a single sheet covering the entire non-display region of the color-filter substrate. Of course, the first film layer may also be divided into or arranged as a plurality of sheets with smaller sizes.

By using the disclosed devices and methods, a first film layer can be formed on the surface of a non-display region of a display substrate, and the surface of the non-display region of the substrate can become flat and even. In the rubbing process, when a rubbing cloth is used to rub the substrate for forming the alignment film, it can be ensured that the orientation of the rubbing cloth fiber is consistent, reducing occurrence of Rubbing Mura in the rubbing process for forming the alignment film and improving the display quality of the substrate. At the same time, the flat and even surface of the non-display region can reduce the wear and tear of the rubbing cloth, extending the usage life of the rubbing cloth and reducing the production cost of the display substrate.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. A display substrate, comprising:
   a display region with an alignment film formed on one side of the display region;
   a non-display region at a peripheral area of the substrate and adjacent to the display region;
   an uneven layer formed on the non-display region at a same side as the alignment film; and
   a first film layer formed on the uneven layer and covering the uneven layer to form a substantially flat surface of the non-display region with respect to the display region,
   wherein the display substrate is an array substrate;
   the uneven layer includes signal testing lines and signal testing pads located on the non-display region of the substrate; wherein the signal testing lines are closer to an edge of the array substrate than the signal testing pads; and
   the first film layer covers the signal testing lines and signal testing pads and is sheet-shaped, or a first portion of the first film layer covering the signal testing pads is sheet-shaped and a second portion of the first film layer covering the signal testing lines is strip-shaped.

2. The display substrate according to claim 1, wherein:
   the substantially flat surface of the non-display region is configured according to and transitioned to the surface of the display region such that the non-display region maintains consistent orientation of a rubbing cloth during a rubbing process when the rubbing cloth moves from the non-display region to the display region.

3. The display substrate according to claim 1, wherein:
   the first film layer is a conductive layer;
   an insulating layer is formed between the first film layer and the uneven layer including the signal testing lines and the signal testing pads;
   the first film layer is arranged as a plurality of sheet sub-film-layers, and the sub-film-layers at least partially overlaps with different signal testing lines or signal testing pads; and
   each of the plurality of sheet sub-film-layers completely covers at least one of the signal testing lines or at least one of the signal testing pads, and each of the plurality of sheet sub-film-layers electrically connected to the at least one of different signal testing lines or the at least one of signal testing pads through vias;
different one of the plurality of sheet sub-film-layers covers different at least one of signal testing lines or different at least one of the signal testing pads.

4. The display substrate according to claim 1, wherein:
the first portion of the first film layer covering the signal testing pads is arranged as a plurality of sheets of first sub-film-layers, each of the plurality of sheets of first sub-film-layers completely covers a different signal testing pad and an adjacent insulation sheet.

5. The display substrate according to claim 4, wherein:
the second portion of the first film layer covering the signal testing lines is arranged as a plurality of strips of second sub-film-layers arranged in parallel and with an equal width;
distance between any two of the plurality of strips of second sub-film-layers is equal; and
a direction along length of any one of the plurality of strips of second sub-film-layers is same as alignment orientation of the alignment film.

6. The display substrate according to claim 5, wherein:
the distance between two adjacent strips of the plurality of strips of second sub-film layers is greater than or equal to a diameter of cloth fiber of the rubbing cloth for forming the alignment orientation of the alignment film in the rubbing process.

7. The display substrate according to claim 6, wherein:
the distance between two adjacent strips of the plurality of strips of second sub-film-layers is in a range of approximately 10-13 μm; and
a width of the strips of any one of the plurality of strips of second sub-film-layers is in a range of approximately 10-15 μm.

8. The display substrate according to claim 5, wherein:
the first film layer is a conductive layer;
an insulating layer is formed between the first film layer and the signal testing lines and the signal testing pads;
an area where each one of the plurality of sheets of first sub-film-layers completely covers a different signal testing pad has a first via, such that the signal testing pad is electrically connected to the one of the plurality of sheets of first sub-film-layer through the first via; and
an area where certain one of the plurality of strips of second sub-film-layers covers a different signal testing line has a second via, such that the signal testing line is electrically connected to the certain one of the plurality of strips of second sub-film-layers through the second via.

9. The display substrate according to claim 8, further including:
pixel electrodes formed on the display region of the array substrate,
wherein the first film layer is made of a same material as the pixel electrodes and is formed in a same patterning process as the pixel electrodes.

10. The display substrate according to claim 1, wherein:
the first film layer is a non-conductive layer; and
areas covering the signal testing lines and the signal testing pads have openings such that external signal testing probes are connected with the signal testing lines or the signal testing pads through the openings.

11. The display substrate according to claim 10, wherein:
the uneven layer includes a coding region adjacent to the signal testing lines and the signal testing pads for forming an identification code to identify the substrate; and
a portion of the first film layer covering the coding region is sheet-shaped, and separate from the portion of the first film layer covering the signal testing lines and the signal testing pads.

12. The display substrate according to claim 1, wherein:
the display substrate is a color-filter substrate;
the uneven layer includes a back array and color film layer located in the non-display region close to edge of the color-filter substrate; and
the first film layer is strip-shaped.

13. The display substrate according to claim 12, wherein:
the first film layer is arranged as a plurality of strips of sub-film-layers arranged in parallel and with an equal width;
distance between any two strips of sub-film-layers is equal; and
a direction along length of the strips of sub-film-layers is the same as alignment orientation of the alignment film.

14. The display substrate according to claim 13, wherein:
the distance between two adjacent strips of sub-film-layers of the plurality of strips of sub-film-layers is greater than or equal to a diameter of cloth fiber of the rubbing cloth for forming the alignment orientation of the alignment film in the rubbing process;
the distance between two adjacent strips of second sub-film-layers of the plurality of strips of the second sub-film-layers is in a range of approximately 10-13 μm; and
a width of any one of the plurality of the strips of second sub-film-layers is in a range of approximately 10-15 μm.

15. The display substrate according to claim 14, wherein:
a flat layer formed in the display region of the color-filter substrate; and
the first film layer is made of a same material as the flat layer and formed in a same patterning process as the flat layer.

16. A display device comprising a display substrate according to claim 1.

17. A fabrication method for a display substrate having a display region and a non-display region at a peripheral area of the substrate, the method comprising:
forming an uneven layer on the non-display region, wherein the uneven layer includes signal testing lines and signal testing pads located on the non-display region of the substrate; and
forming a first film layer on the uneven layer, covering the uneven layer, to form a substantially flat surface of the non-display region with respect to the display region, wherein the display substrate is an array substrate;
the signal testing lines are closer to an edge of the array substrate than the signal testing pads; and
the first film layer covers the signal testing lines and signal testing pads and is sheet-shaped, or a first portion of the first film layer covering the signal testing pads is sheet-shaped and a second portion of the first film layer covering the signal testing lines is strip-shaped.

18. The fabrication method according to claim 17, wherein:
the display region has an alignment film formed on one side of the display region, the noon-display region is positioned adjacent to the display region, and forming the first film layer further includes:

forming the first film layer to form a substantially flat surface of the non-display region with respect to the display region such that the non-display region maintains consistent orientation of a rubbing cloth during a rubbing process when the rubbing cloth moves from the non-display region to the display region.

* * * * *